(12) United States Patent
Fukuda et al.

(10) Patent No.: US 10,177,282 B2
(45) Date of Patent: Jan. 8, 2019

(54) METHOD FOR MANUFACTURING PACKAGE, METHOD FOR MANUFACTURING LIGHT EMITTING DEVICE, PACKAGE, AND LIGHT EMITTING DEVICE

(71) Applicant: NICHIA CORPORATION, Anan-shi (JP)

(72) Inventors: Mayumi Fukuda, Tokushima (JP); Tomohisa Kishimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/371,214

(22) Filed: Dec. 7, 2016

(65) Prior Publication Data

US 2017/0170366 A1    Jun. 15, 2017

(30) Foreign Application Priority Data

Dec. 9, 2015   (JP) ................................. 2015-240196

(51) Int. Cl.
*H01L 33/48*  (2010.01)
*H01L 23/495*  (2006.01)
(Continued)

(52) U.S. Cl.
CPC ...... *H01L 33/486* (2013.01); *H01L 23/49575* (2013.01); *H01L 33/56* (2013.01);
(Continued)

(58) Field of Classification Search
CPC ............. H01L 2933/005; H01L 23/498; H01L 23/49565; H01L 2924/15151;
(Continued)

(56) References Cited

U.S. PATENT DOCUMENTS

| 2014/0203304 A1 | 7/2014 | Kim et al. | |
| 2014/0264426 A1* | 9/2014 | Yamashita | ............ H01L 23/495 257/99 |

(Continued)

FOREIGN PATENT DOCUMENTS

| CN | 203466217 U | 3/2014 |
| JP | 2010-186896 | 8/2010 |

(Continued)

*Primary Examiner* — Latanya N Crawford
(74) *Attorney, Agent, or Firm* — Mori & Ward, LLP

(57) ABSTRACT

A method for manufacturing a package includes a step of injecting a first resin through an injection port of a dies in which a lead frame has been placed. The method includes a step of cutting out a portion of a border between a first electrode and a first connection portion running through a first through hole, and cutting out a portion of a border between a second electrode and a second connection portion running through a second through hole after molding the first resin. The method includes a step of electroplating the first and second electrodes. The method includes a step of cutting out a remaining portion of the border between the first electrode and the first connection portion, and cutting out a remaining portion of the border between the second electrode and the second connection portion.

14 Claims, 17 Drawing Sheets

(51) Int. Cl.
*H01L 33/56* (2010.01)
*H01L 33/62* (2010.01)
*H01L 33/64* (2010.01)

(52) U.S. Cl.
CPC ............ *H01L 33/62* (2013.01); *H01L 33/647* (2013.01); *H01L 2224/48247* (2013.01); *H01L 2933/005* (2013.01); *H01L 2933/0016* (2013.01); *H01L 2933/0033* (2013.01); *H01L 2933/0066* (2013.01)

(58) Field of Classification Search
CPC ............... H01L 21/4842; H01L 21/50; H01L 2933/0066; H01L 2924/17151; H01L 33/62; H01L 33/486
See application file for complete search history.

(56) References Cited

U.S. PATENT DOCUMENTS

| | | | |
|---|---|---|---|
| 2015/0340568 A1 | 11/2015 | Hsieh et al. | |
| 2016/0093785 A1* | 3/2016 | Fukuda | H01L 33/005 257/99 |
| 2017/0040516 A1* | 2/2017 | Fukuda | H01L 33/502 |
| 2017/0170366 A1* | 6/2017 | Fukuda | H01L 23/49575 |
| 2017/0200878 A1* | 7/2017 | Fukuda | H01L 33/62 |
| 2017/0288103 A1* | 10/2017 | Fukuda | H01L 33/32 |

FOREIGN PATENT DOCUMENTS

| | | |
|---|---|---|
| JP | 2010-225892 | 10/2010 |
| JP | 2011-103437 | 5/2011 |
| JP | 2012-28694 | 2/2012 |
| JP | 2013-051296 | 3/2013 |
| JP | 2013-077813 | 4/2013 |
| JP | 2013-183013 | 9/2013 |
| JP | 2015-005584 | 1/2015 |
| JP | 2015-170822 | 9/2015 |
| JP | 2015-179737 | 10/2015 |
| JP | 2015-226063 | 12/2015 |
| JP | 2016-072607 | 5/2016 |
| KR | 10-2012-0050283 | 5/2012 |

* cited by examiner

METHOD FOR MANUFACTURING PACKAGE, METHOD FOR MANUFACTURING LIGHT EMITTING DEVICE, PACKAGE, AND LIGHT EMITTING DEVICE

CROSS-REFERENCE TO RELATED APPLICATIONS

The present application claims priority under 35 U.S.C. § 119 to Japanese Patent Application No. 2015-240196, filed on Dec. 9, 2015. The contents of this application are incorporated herein by reference in their entirety.

BACKGROUND

Technical Field

The present invention relates to a method for manufacturing package, a method for manufacturing light emitting device, a package, and a light emitting device.

Discussion of the Background

Patent Document 1 which is Japanese Unexamined Patent Application Publication 2010-186896 and Patent Document 2 which is Japanese Unexamined Patent Application Publication 2013-051296 disclose the methods for manufacturing packages described below. A lead frame is clamped by molding dies. The lead frame is placed on the bottom face of a bottomed recess, and a molding resin is injected into the dies from the back face side which is the opposite side of the open end of the recess. The molding resin is insert-molded, and after solidifying the molding resin, the leads are bent to produce a package.

Patent Document 3 which is Japanese Unexamined Patent Application Publication 2013-077813 discloses a package produced by integrally molding a lead frame and a resin, and has a recess at the upper face where a light emitting element is installed. At the edges of the inner leads embedded in the molded resin, bent terminal portions are provided which are bent upwardly from the bottom of the inner leads which make up the lead frame. The lead frame is bent before being set in the molding dies.

SUMMARY

According to a first aspect of the present disclosure, a method for manufacturing a package includes: a step of preparing a lead frame which has a frame, a first electrode, a second electrode, a first connection portion connecting the frame and the first electrode, and a second connection portion connecting the frame and the second electrode, wherein a first through hole is provided between the first electrode and the first connection portion, and a second through hole is provided between the second electrode and the second connection portion; a step of placing the lead frame in dies; a step of injecting a first resin through an injection port of the dies in which the lead frame has been placed and molding the first resin; a step of cutting out a portion of a border between the first electrode and the first connection portion running through the first through hole, and cutting out a portion of a border between the second electrode and the second connection portion running through the second through hole after molding the first resin; a step of electroplating the first electrode and the second electrode; and a step of cutting out a remaining portion of the border between the first electrode and the first connection portion running through the first through hole, and cutting out a remaining portion of the border between the second electrode and the second connection portion running through the second through hole.

According to a second aspect of the present disclosure, a method for manufacturing a package includes: a step of preparing a lead frame which has a first electrode and a second electrode different from the first electrode in a package forming area, a first through hole on a first electrode side at a position straddling an outer edge of the package forming area, and a second through hole on a second electrode side; a step of placing the lead frame in dies; a step of injecting a first resin through an injection port of the dies in which the lead frame has been placed and molding the first resin; a step of cutting out a portion of the lead frame running through the first through hole and a portion of the lead frame running through the second through hole at the outer edge of the package forming area after molding the first resin; a step of electroplating the first electrode and the second electrode; and a step of cutting out a remaining portion of the lead frame running through the first through hole and a remaining portion of the lead frame running through the second hole at the outer edge of the package forming area.

According to a third aspect of the present disclosure, a package includes: a first electrode located at a bottom portion of a bottomed recess and having a first outer lead which has a first indentation at a tip in a plan view; a second electrode located at the bottom portion of the bottomed recess and having a second outer lead which has a second indentation at a tip in a plan view; and a first resin securing the first electrode and the second electrode in place and forming a part of the bottomed recess. The first resin has at least a portion between the first electrode and the second electrode located at the bottom portion of the bottomed recess, wall portions structuring lateral walls of the bottomed recess, and flange portions having the same thickness as a thickness of the first outer lead and different outward widths from the wall portions on both sides of the first outer lead in a plan view.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
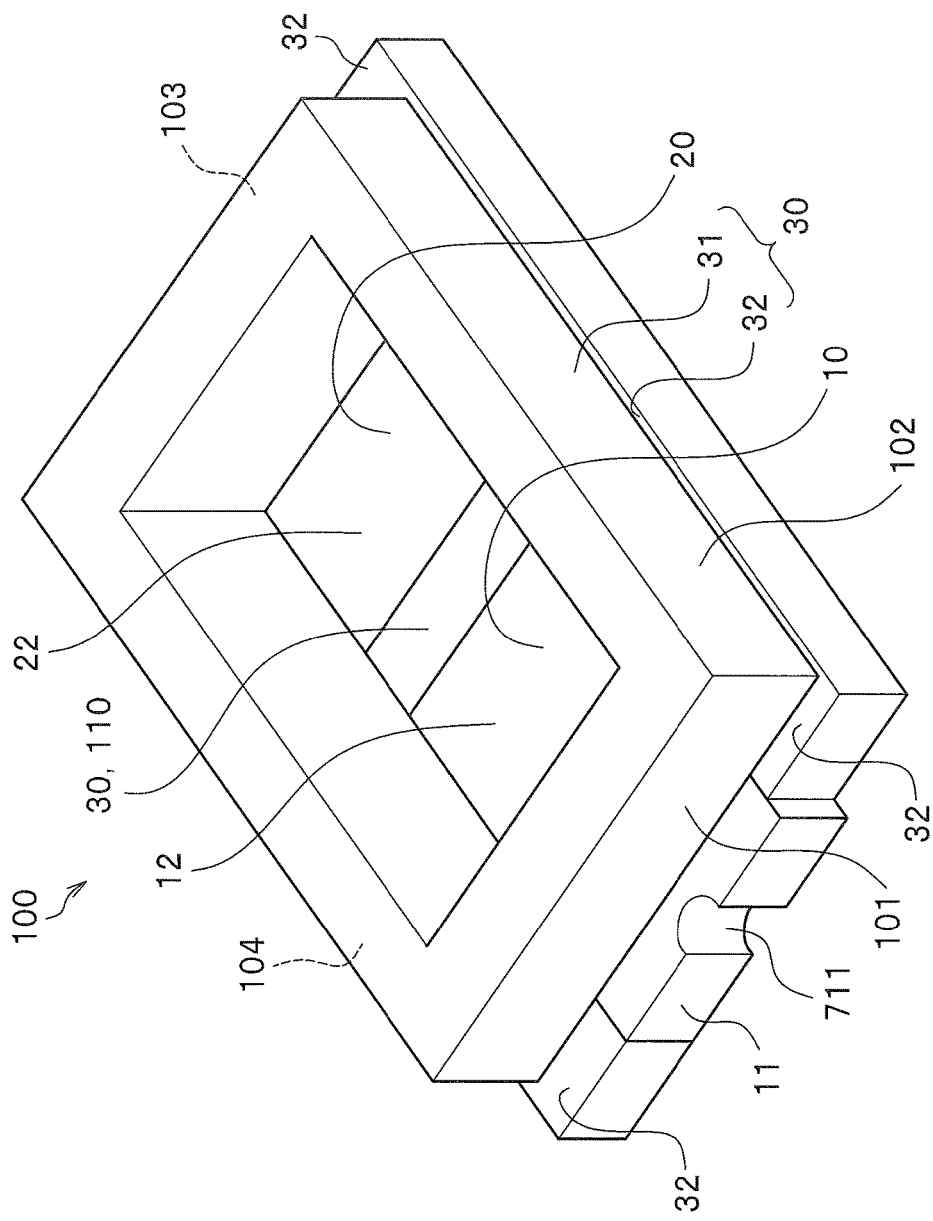
FIG. 1 is a schematic diagram of the package according to one embodiment, and is a perspective view of the whole package.

The embodiments will now be described with reference to the accompanying drawings, wherein like reference numerals designate corresponding or identical elements throughout the various drawings.

The method for manufacturing a package, the method for manufacturing a light emitting device, the package, and the light emitting device shown as an exemplary embodiment will be explained below. Since the drawings referenced in the explanation are schematic representations of the embodiment, the scaling, spacing, and relative positions of the members might be exaggerated, or some members might be omitted. In the explanation below, the same designations and reference numerals are given to the same members or those of similar quality, for which the detailed explanation are omitted when appropriate.

Unless otherwise noted, the direction perpendicular to the wall portions is referred to as the "width," and the direction in parallel to the wall portions is referred to as the "length."

Structure of Package 100

Figure 2:
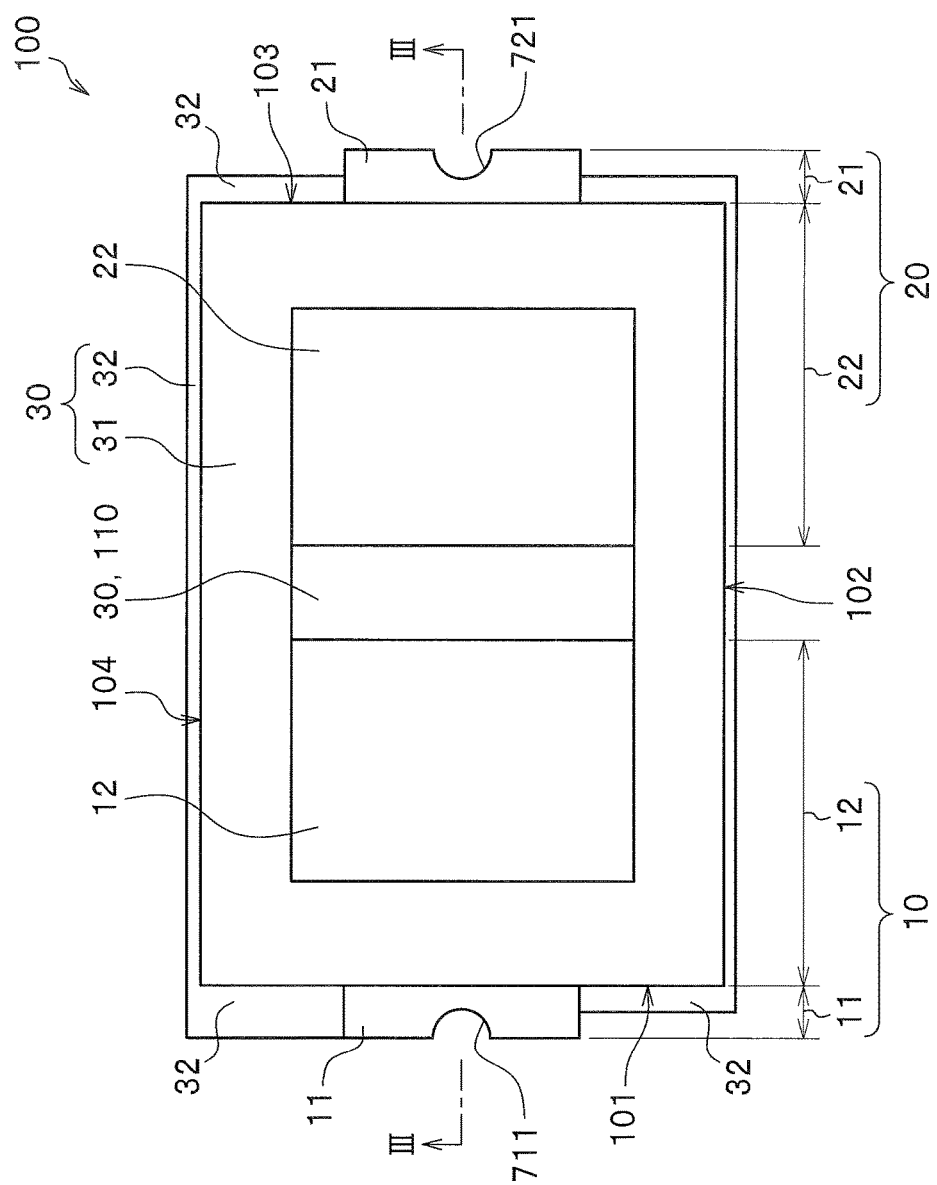
FIG. 2 is a schematic diagram of the package according to the embodiment, and is a top view of the package.
Figure 3:
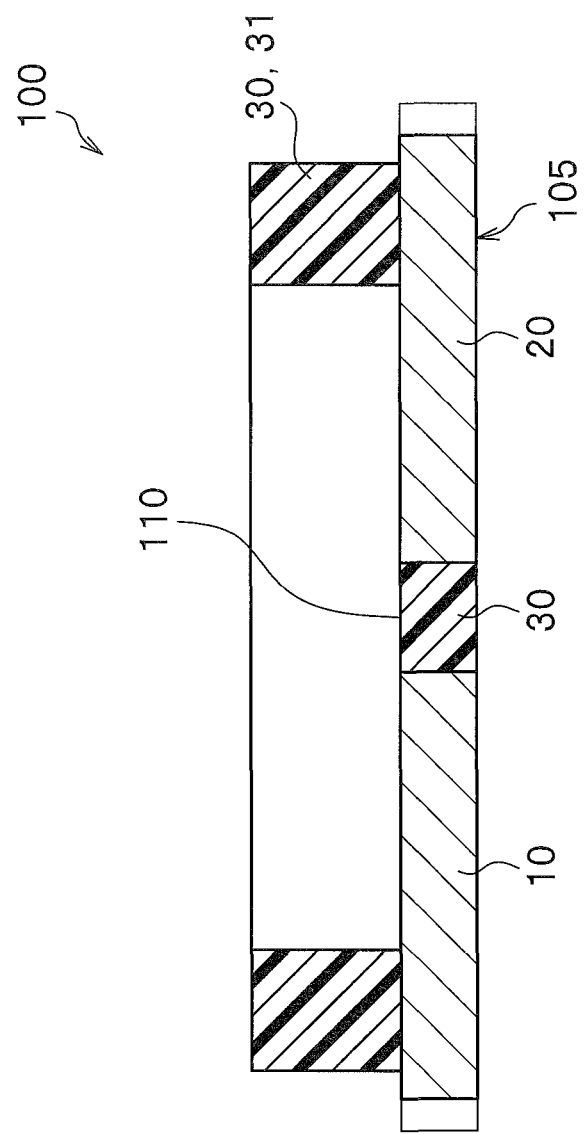
FIG. 3 is a schematic diagram of the package according to the embodiment, and is a sectional view along line III-III indicated in FIG. 2.
Figure 4:
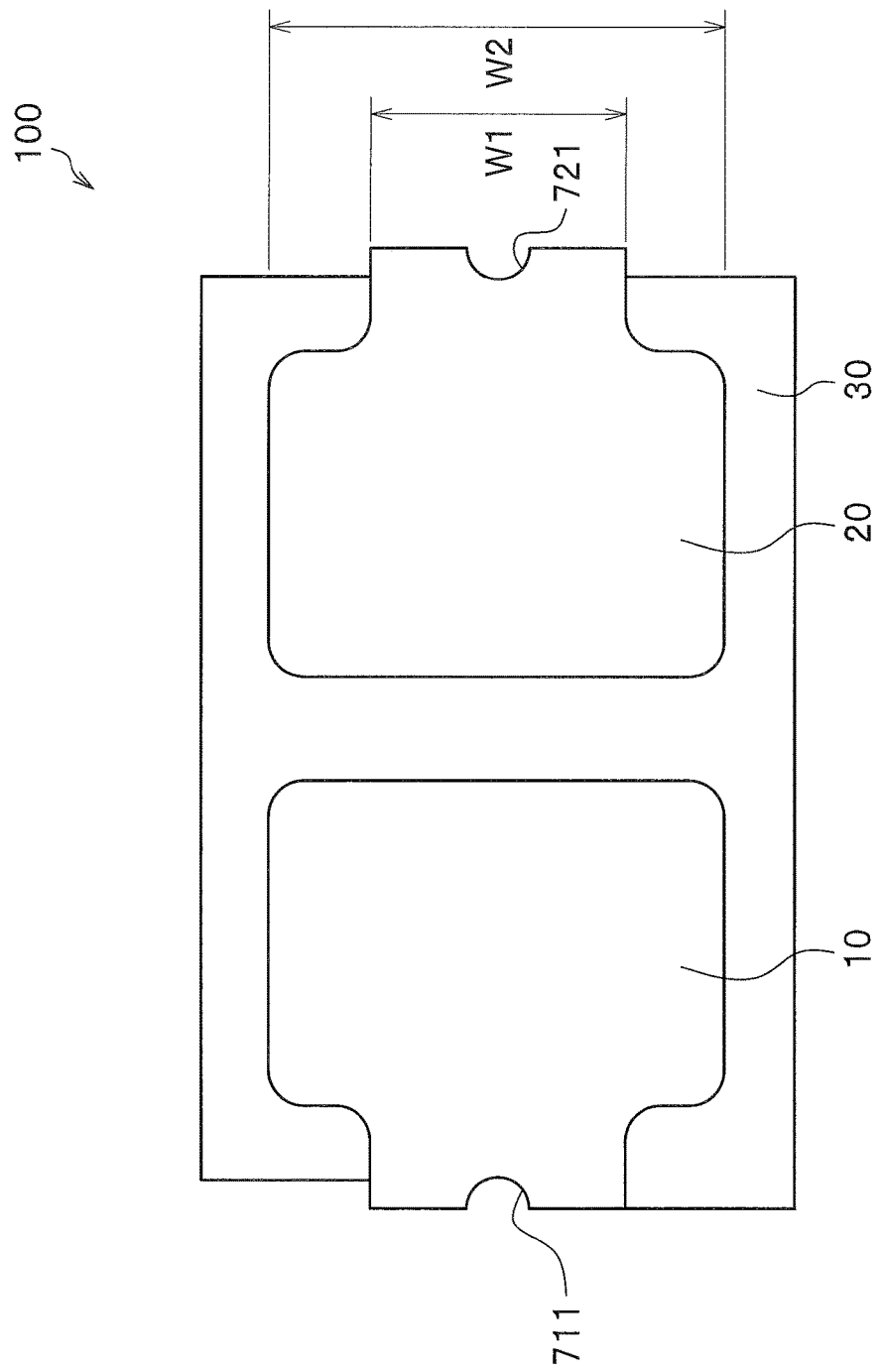
FIG. 4 is a schematic diagram of the package according to the embodiment, and is a bottom view of the package.

An explanation will follow by using the drawings. FIG. 1 is a schematic diagram of the package according to one embodiment, and is a perspective view of the whole package. FIG. 2 is a schematic diagram of the package according to the embodiment, and is a top view of the package. FIG. 3 is a schematic diagram of the package according to the embodiment, and is a sectional view along line III-III indicated in FIG. 2. FIG. 4 is a schematic diagram of the package according to the embodiment, and is a bottom view of the package.

The overall shape of the package 100 is substantially a rectangular parallelepiped, and a bottomed recess 110 is formed therein. The package 100 includes a first electrode 10, a second electrode 20, and a first resin 30.

The first electrode 10 includes a first outer lead portion 11 and a first inner lead portion 12.

The first outer lead portion 11 refers to the lead portion located on the outer side of the wall portion 31 of the first resin 30. The first outer lead portion 11 has a first indentation 711 at the tip, and forms a shape which extends perpendicularly to the wall portions 31. The shape, however, is not limited to this, and may have an additional cutout, indentation, or hole.

The first inner lead portion 12 refers to the lead portion located on the inner side of, and under the wall portion 31 of the first resin 30. The shape of the first inner lead portion 12 is substantially rectangular in a plan view. The shape, however, is not limited to this, and may have a cutout, an indentation, or a hole. In a back view of the package 100, the width W1 of the first outer lead portion 11 exposed from the first resin 30 in this embodiment is smaller than the width W2 of the first inner lead portion 12 exposed from the first resin 30. The first inner lead 12 is located at the bottom of the bottomed recess 110.

The second electrode 20 includes a second outer lead portion 21 and a second inner lead portion 22. The second outer lead portion 21 refers to the lead portion located on the outer side of the wall portion 31 of the first resin 30. The second outer lead 21 includes a second indentation 721 at the tip, and forms a shape which extends perpendicularly to the wall portions 31. The shape, however, is not limited to this, and may include an additional cutout, indentation, or hole.

The second inner lead portion 22 refers to the lead portion located on the inner side of, and under the wall portion 31 of the first resin 30. The shape of the second inner lead portion 22 is substantially rectangular in a plan view. The shape, however, is not limited to this, and may have a cutout, an indentation, or a hole. In a back view of the package 100, the width W1 of the second outer lead portion 21 exposed from the first resin 30 in this embodiment is smaller than the width W2 of the second inner lead portion 22 exposed from the first resin 30. The second inner lead 12 is located at the bottom of the bottomed recess 110.

The first electrode 10 and the second electrode 20 are formed to be outwardly exposed from the first resin 30 at the bottom face 105 of the package 100. The outer side of the bottom face 105 of the package 100 is the face to be mounted on an external circuit board. The first electrode 10 and the second electrode 20 are spaced apart, and the first resin 30 interposed between the first electrode 10 and the second electrode 20 forms a part of the bottom portion of the bottomed recess 110. When used as a light emitting device 1, the first electrode 10 and the second electrode 20 correspond to an anode and a cathode, respectively, meaning that the polarity differs between the two.

The lengths, widths, thicknesses of the first electrode 10 and the second electrode 20 are not particularly limited, and can suitably be selected in accordance with the objectives and applications. The upper face, the lower face, the lateral face of the first indentation 711, and one of the end faces contiguous with the first indentation 711 of the first outer lead portion 11 are covered by a metal, while the other end face contiguous with the first indentation 711 is not covered by a metal. The upper face, the lower face, the lateral face of the second indentation 721, and one of the end faces contiguous with the second indentation 721 of the second outer lead portion 21 are covered by a metal, while the other end face contiguous with the second indentation 721 is not covered by a metal. Covering the first outer lead portion 11 and the second outer lead portion 21 with a metal in this way can improve the mountability of the light emitting device 1 when mounting the light emitting device 1 using solder or the like. Solder has poor adhesion with an unplated portion of the lead frame, but has good adhesion with a plated portion. Thus, increasing the plated metal layer areas allows solder to creep up the metal layers to improve mountability.

For the materials used for the first electrode 10 and the second electrode 20, for example, copper, iron, copper alloys, and ferroalloys are preferable. The outermost surface is preferably covered with a metal material having a high optical reflectance, such as silver, aluminum, gold, or the like. The thickness of the metal covering the first electrode 10 is not particularly limited, but is preferably a thickness that allows for efficient optical reflection in a range between about 0.1 and about 0.3 µm, more preferably in a range between about 1 and about 20 µm. The metal is preferably formed as a uniform film or layer. The metal layer may be of a single layer or multiple layers of two or more.

The first resin 30 includes wall portions 31 and flange portions 32. The first resin 30 secures the first electrode 10 and the second electrode 20 in place. The wall portions 31 constitute the lateral walls of the bottomed recess 110. The flange portions 32 have substantially the same thickness as that of the first outer lead portion 11, and the flange portions located on both sides of the first outer lead portion 11 in a plan view have different widths outwardly from the wall portion 31. The wall portions 31 are formed on the first electrode 10 and the second electrode 20, the four sides forming a rectangle. The wall portions 31 are formed so that two opposing sides of the rectangle shape interpose the first electrode 10, and interpose the second electrode 20. This allows the wall portions 31 to secure the first electrode 10 and the second electrode 20 in place. The first resin 30 is also present between the first electrode 10 and the second electrode 20 located at the bottom portion of the bottomed recess 110. The first resin 30 at the bottom portion of the bottomed recess 110 having "substantially the same thickness" as that of the first electrode 10 here means that the thickness of the first resin 30 is 0.8 to 1.0 times the thickness of the first electrode 10. It can physically be given the same thickness, i.e. 1.0 times the thickness, but the first resin 30 can be thinner than the first electrode 10. For example, the thickness of the first resin 30 between the first electrode 10 and the second electrode 20 can be made thinner than the thickness of the first electrode 10. This can more effectively prevent shorting between the first electrode 10 and the second electrode 20. Moreover, the first resin 30 can be inwardly depressed relative to the first electrode 10 and the second electrode 20 in a back view.

The first resin 30 is expressed as the first resin 30 regardless of whether it is before or after molding, curing or solidifying. In the case where an epoxy resin is used for the first resin 30, for example, the first resin 30 has no shape or in liquid state prior to molding, but has a prescribed shape following molding.

In a plan view, the package 100 has a first outer lateral face 101, a second outer lateral face 102 contiguous with the first outer lateral face 101, a third outer lateral face 103 contiguous with the second outer lateral face 102 and opposing the first outer lateral face 101, and a fourth outer lateral face 104 contiguous with the first outer lateral face 101 and the third outer lateral face 103. The first outer lead 11 is located at the first outer lateral face 101, and the second outer lead 21 is located at the third outer lateral face 103.

The wall portions 31 are formed to structure a rectangular recess in a plan view, and the shape thereof is a rectangular annulus. The height, length, and width of the wall portions 31 are not particularly limited, and can suitably be selected in accordance with the objectives and applications.

In a plan view, the first resin 30 has flange portions 32. The flange portions 32 project laterally from the wall portions 31. The flange portions 32 are formed next to the first outer lead portion 11 located at the first outer lateral face 101, and next to the second outer lead portion 21 located at the third outer lateral face 103. The width of the flange portion 32 next to the first outer lead portion 11 on one side is substantially the same as width of the first outer lead portion 11, and the width of the flange portion 32 on the other side is smaller than the width of the first outer lead portion 11. The widths of the flange portions 32 next to the second outer lead portion 12 on both sides are substantially the same as the width of the second outer lead portion 21. Forming them in this way can provide a cathode mark or an anode mark. The flange portions 32 are located on both sides of the second outer lead portion 21 at the third outer lateral face 103, but it suffices to be provided at least on one side. The flange portions 32 are also provided at the second outer lateral face 102 and the fourth outer lateral face 104 here, but can be provided only at one of the second outer lateral face 102 and the fourth outer lateral face 104. The width of the flange portion 32 located at the second outer lateral face 102 and the width of the flange portion 32 located at the fourth outer lateral face 104 are preferably the same. This provides a balanced layout for stability. Giving the flange portions 32 the same width makes the stress applied to the flange portions 32 uniform. The width of the smaller width flange next to the first outer lead 11 is preferably the same as the width of the flange portion 32 located at the second outer lateral face 102 because this can make the stress applied to the flange portions 32 uniform. Moreover, it is preferable to make the thickness of the first electrode 10, the thicknesses of the flange portions 32 on both sides of the first outer lead portion 11, and the thickness of the flange portion 32 located at the second outer lateral face 102 substantially equal. This can also make the stress applied to the flange portions 32 uniform.

The second outer lateral face 102 and the fourth outer lateral face 104 are preferably composed only of the first resin 30. In other words, neither the first electrode 10 nor the second electrode 20 are exposed. This can reduce the penetration of moisture or the like into the first resin 30.

The first outer lead portion 11, the second outer lead portion 21, and the flange portions 32 may be formed so that they are coplanar, or the first outer lead portion 11 and the second outer lead portion 21 may be outwardly projected. Because this enables mounting with the first outer lead portion 11 and the second outer lead portion 21, which improves mounting stability. In this embodiment, the injection port 555 for the first resin 30 is provided on one side of the first electrode 10 which will be cut and removed after injecting, and curing or solidifying the first resin 30. When that portion is cut and removed after the resin 30 has been injected, and cured or solidified, there will only remain one flange portion 32 next to the first electrode 10. The first resin 30 includes the flange portions 32 at four faces of the wall portions 31, but the number of the flange portions can be any as long as it is one or more. The outer lateral faces of the wall portions 31 having no flange portion will be planar from the upper face to the bottom face.

The widths of the flange portions 32 located at the first outer lateral face 101 are preferably the same as, or shorter than the width of the wall portion 31. The width of the flange portions 32 located at the second outer lateral face 102, the third outer lateral face 103, and the fourth outer lateral face 104 is preferably shorter than the width of the wall portions 31. The widths of the flange portions 32 depend on the size of the package 100, but is preferably 1 mm or smaller, more preferably 0.5 mm or smaller, even more preferably 0.1 mm or smaller.

Examples of the materials for the first resin 30 include thermoplastic resins and thermosetting resins.

In the case of thermoplastic resins, for example, polyphthalamide resins, liquid crystal polymers, polybutylene terephthalate (PBT), unsaturated polyester, and polyamide resins can be used.

In the case of thermosetting resins, for example, epoxy resins, modified epoxy resins, silicone resins, and modified silicone resins can be used.

It is preferable for the first resin 30 to contain a light reflecting material in order for the inner faces of the wall portions 31 of the first resin 30 to efficiently reflect light. Examples of light reflecting materials include white fillers having high reflectance, such as titanium oxide, glass filler, silica, alumina, and zinc oxide. The visible light reflectance of 70% or higher, or 80% or higher is preferable. Particularly, reflectance of 70% or higher, or 80% or higher in the wavelength range of the light emitted by the light emitting element is preferable. The content of titanium oxide or the like is in a range between 5 wt % and 50 wt %, preferably, without limitation, in a range of 10 wt % and 30 wt %.

As described above, the package 100 can have a reduced thickness because the injection port 555 for the first resin 30 is provided in the area to be cut and removed after curing or solidifying the first resin 30. Particularly, the thickness of the back face of the package 100, i.e., the thicknesses of the flange portions 32 of the first resin 30, the first electrode 10, the second electrode 20, and the like can be reduced as compared to conventional packages. This can improve the heat dissipation properties during the operation of the light emitting element mounted on the package 100.

Method for Manufacturing Package 100 and Light Emitting Device 1

Figure 5:
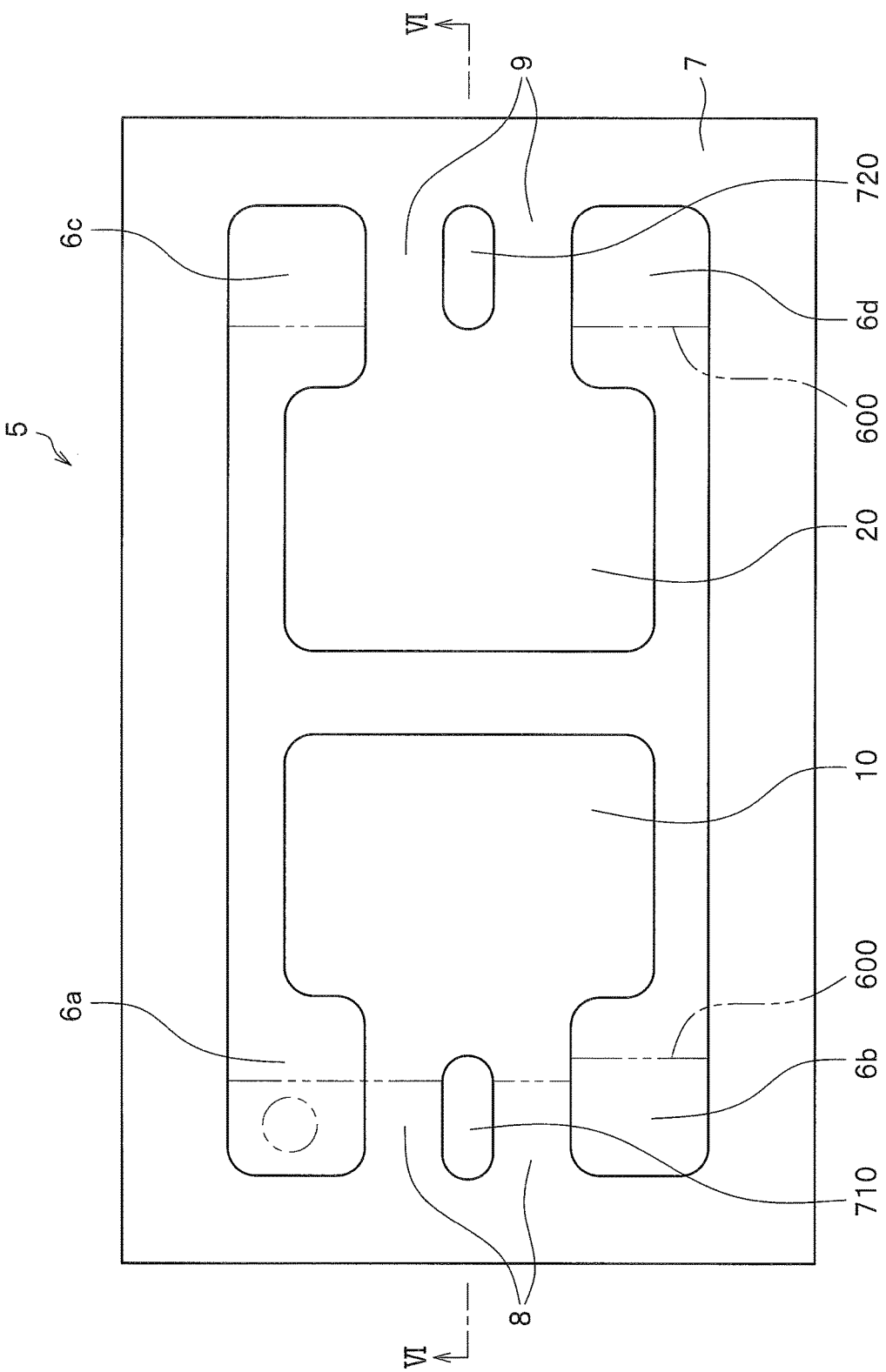
FIG. 5 is a schematic diagram of a manufacturing step of the package according to the embodiment, and is a plan view of the lead frame.
Figure 6:
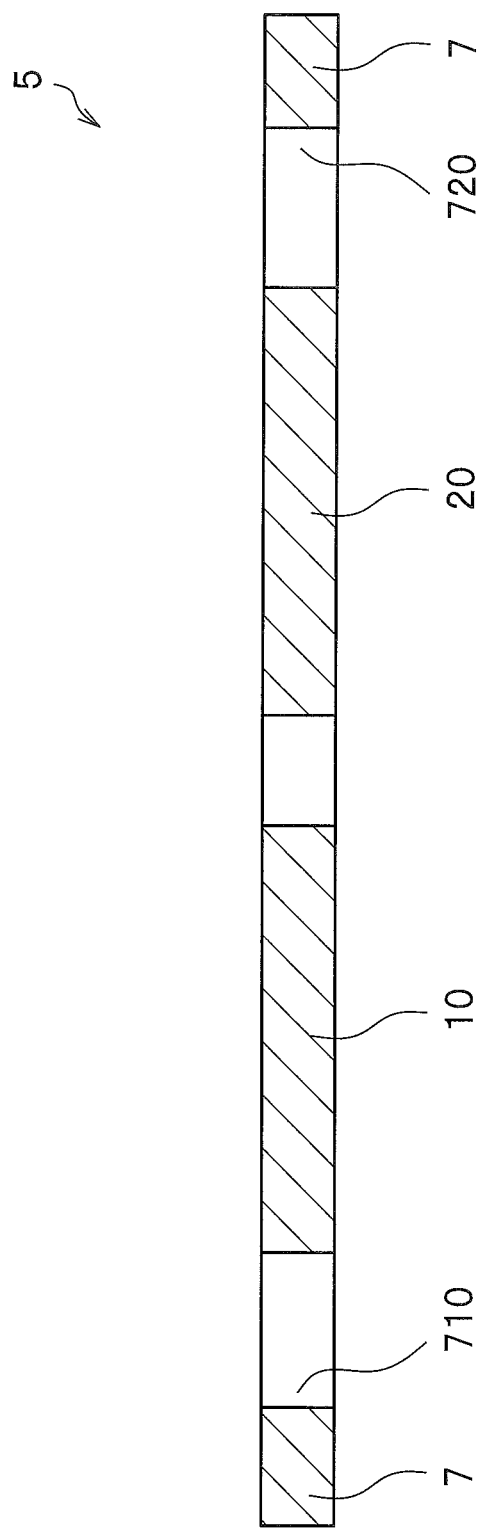
FIG. 6 is a schematic diagram of a manufacturing step of the package according to the embodiment, and is a sectional view along line VI-VI indicated in FIG. 5.
Figure 7:
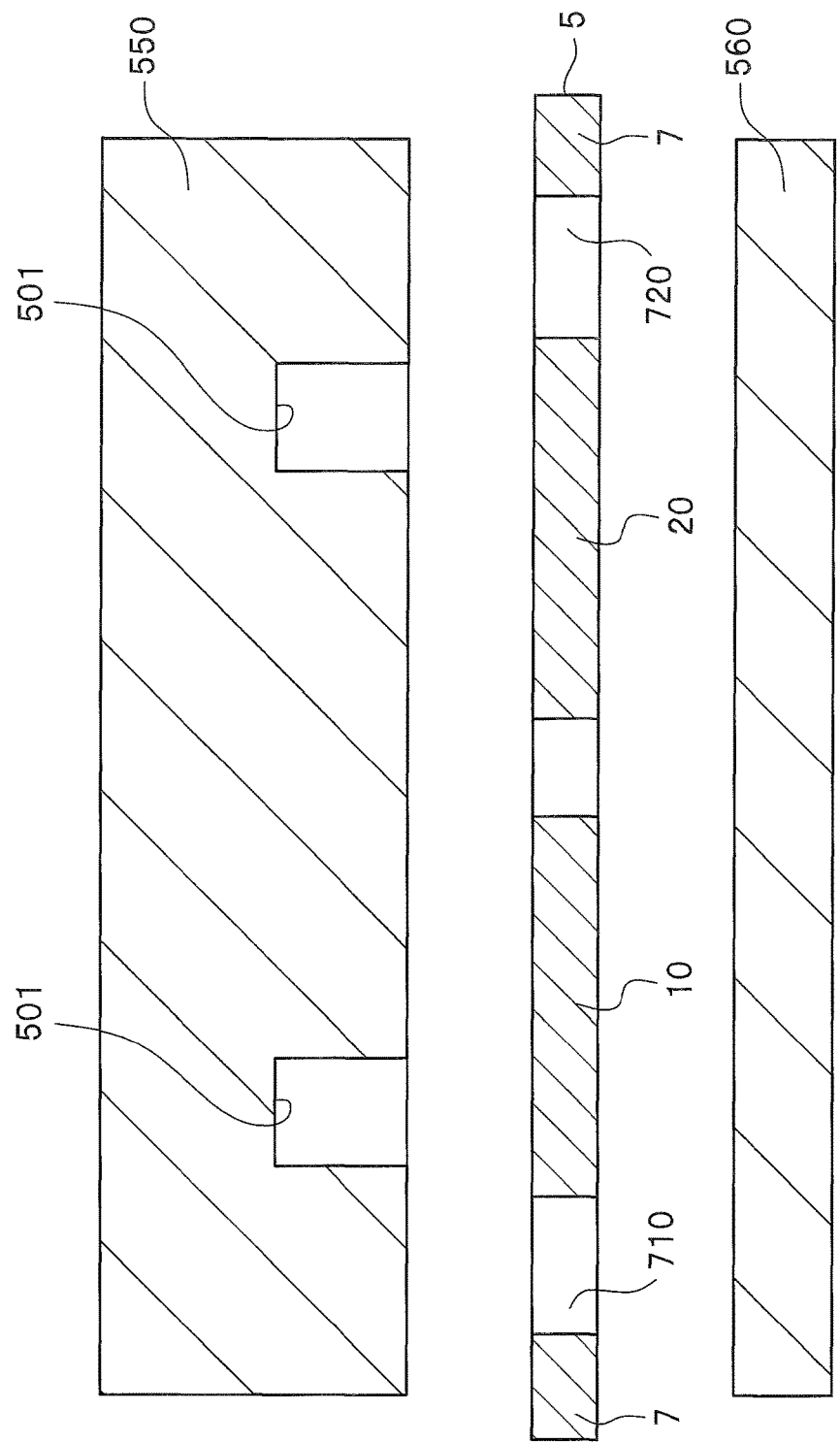
FIG. 7 is a schematic diagram of a manufacturing step of the package according to the embodiment, and is a sectional view of the layout of the lead frame and the molding dies at the position corresponding to line X-X indicated in FIG. 9.
Figure 8:
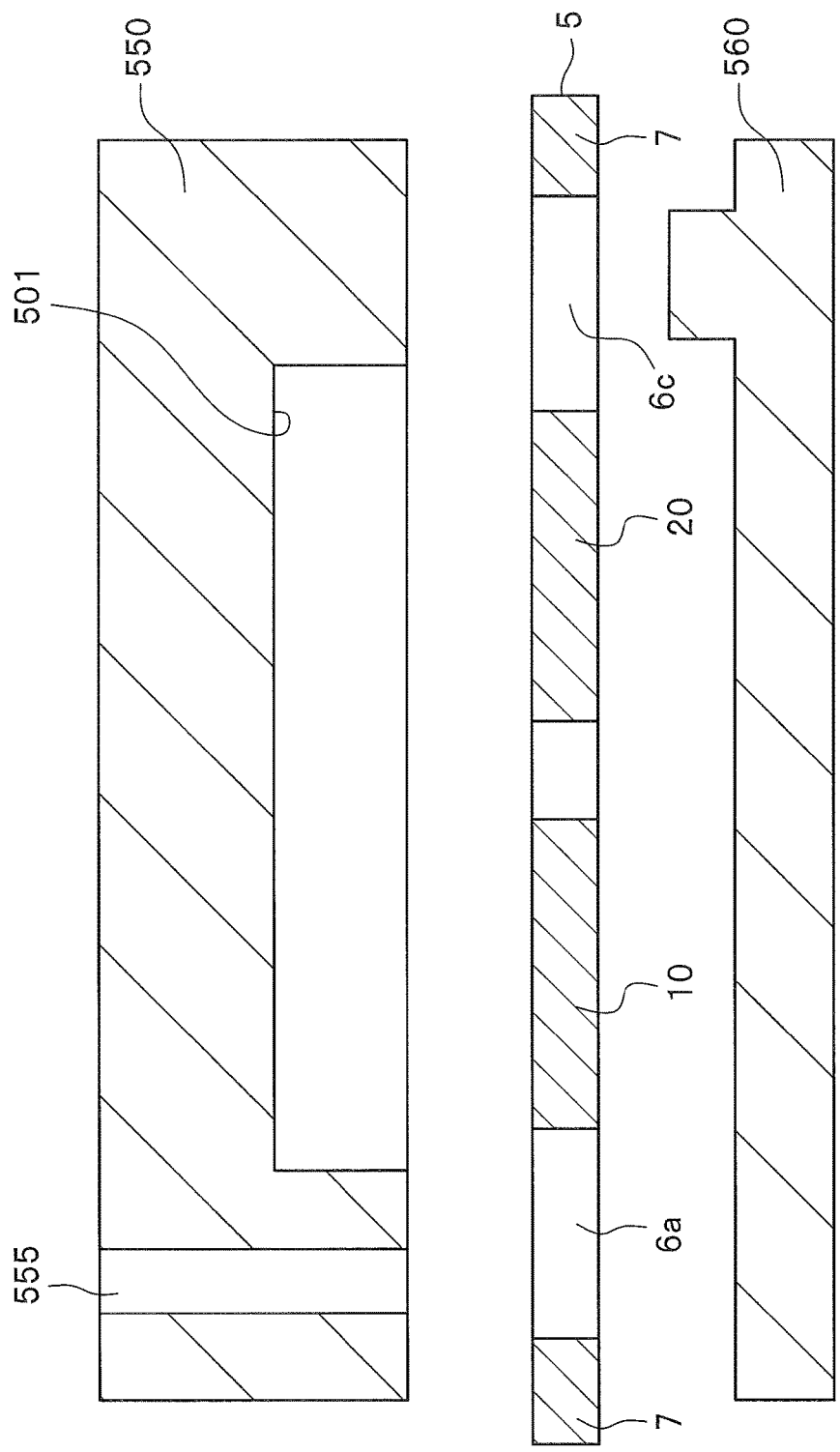
FIG. 8 is a schematic diagram of a manufacturing step of the package according to the embodiment, and is a sectional view of the layout of the lead frame and the molding dies at the position corresponding to line XI-XI indicated in FIG. 9.
Figure 9:
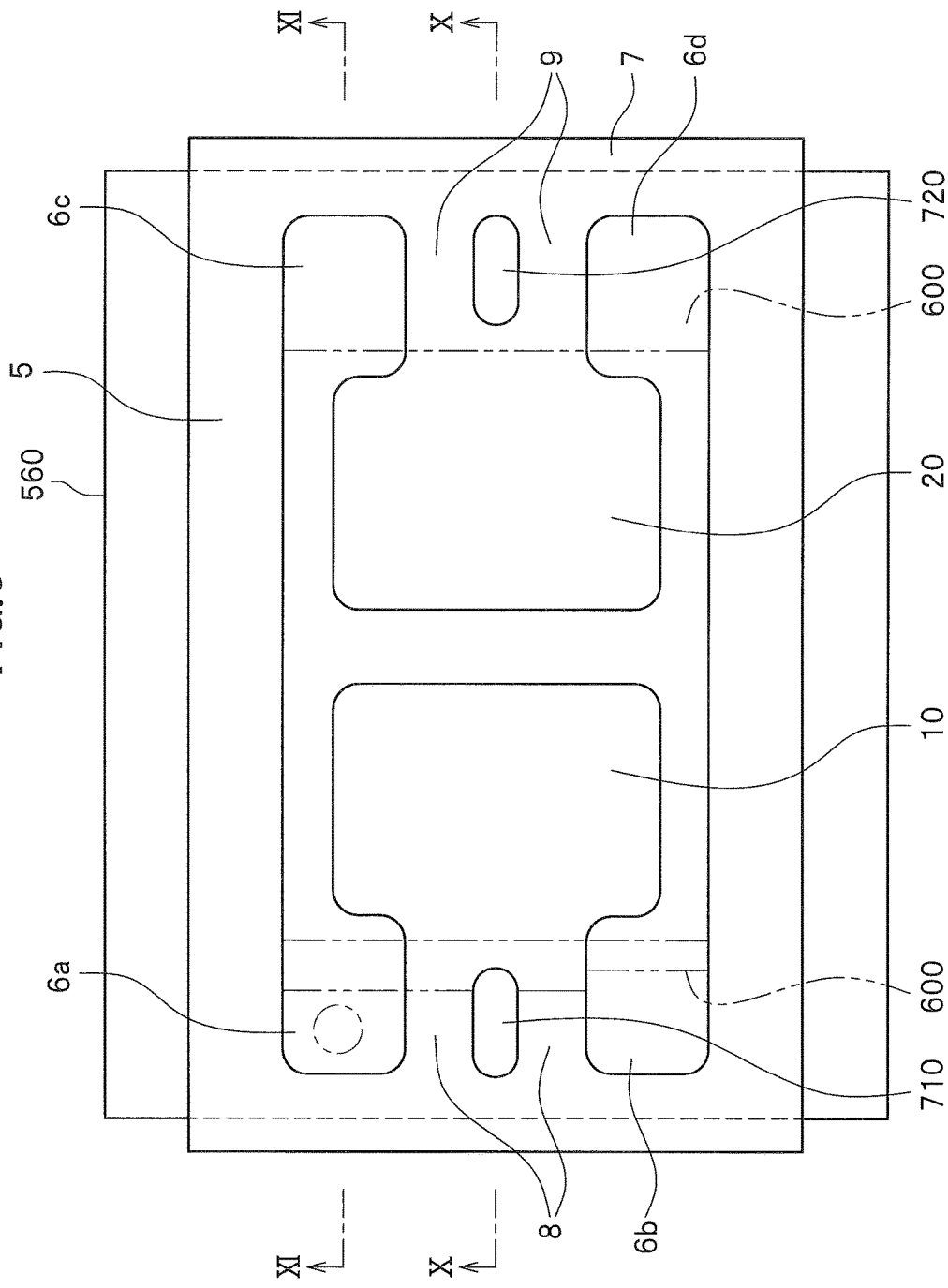
FIG. 9 is a schematic diagram of a manufacturing step of the package according to the embodiment, and is a top view of the lead frame.
Figure 10:
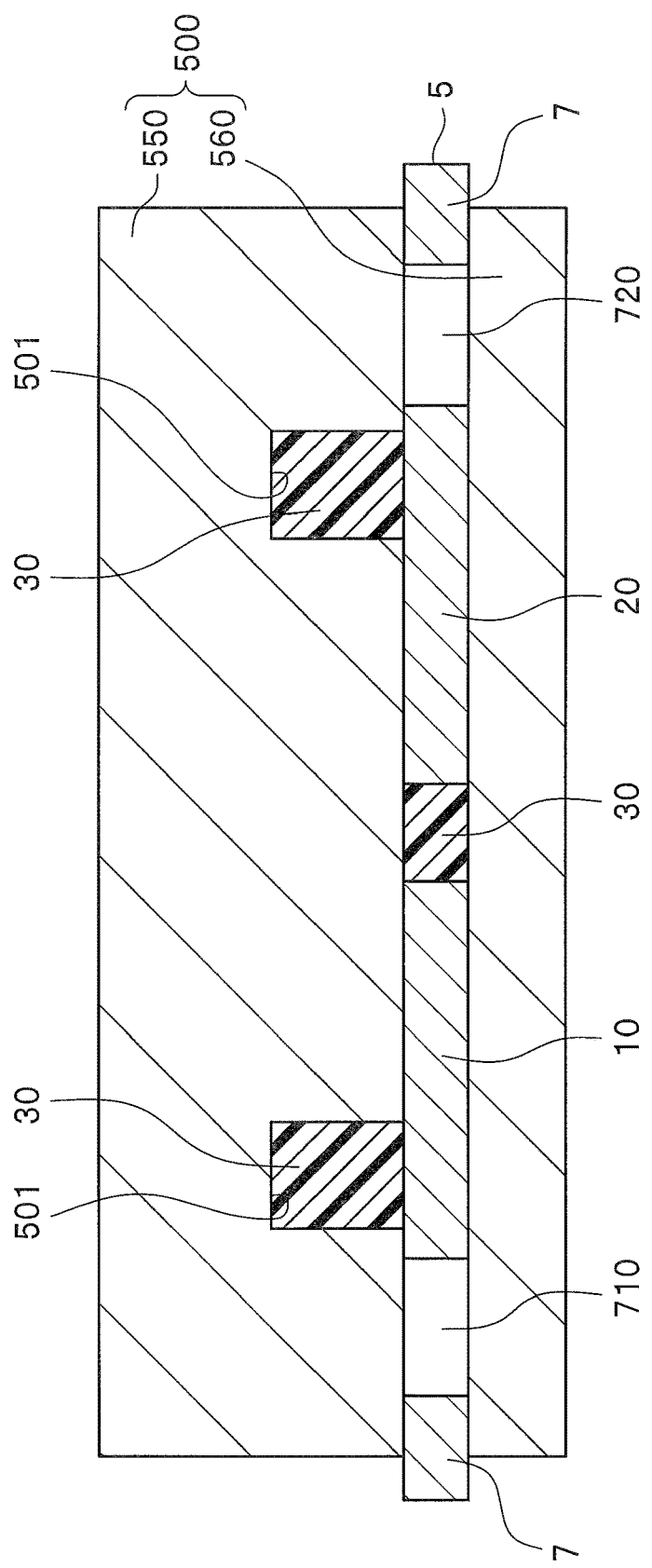
FIG. 10 is a schematic diagram of a manufacturing step of the package according to the embodiment, and is a sectional view along line X-X indicated in FIG. 9 after injecting the first resin.
Figure 11:
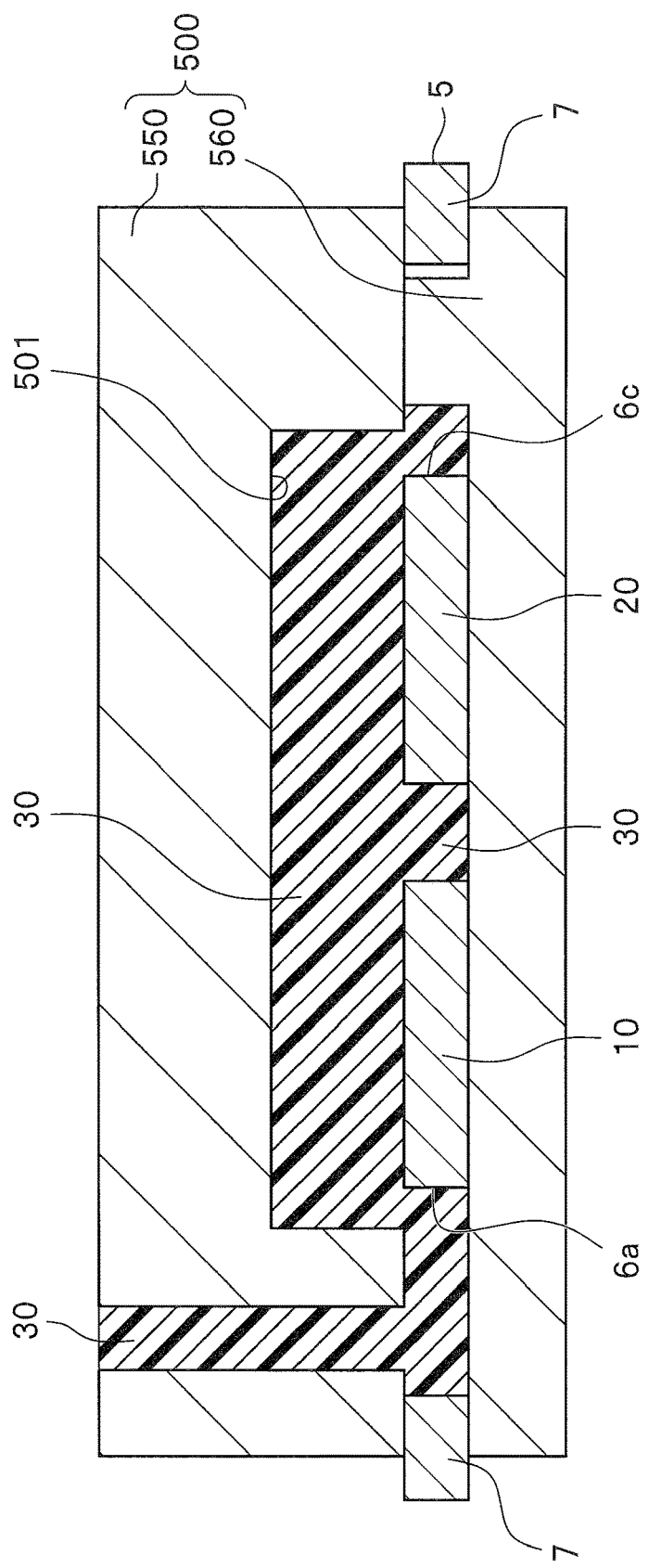
FIG. 11 is a schematic diagram of a manufacturing step of the package according to the embodiment, and is a sectional view along line XI-XI indicated in FIG. 9 after injecting the first resin.
Figure 12:
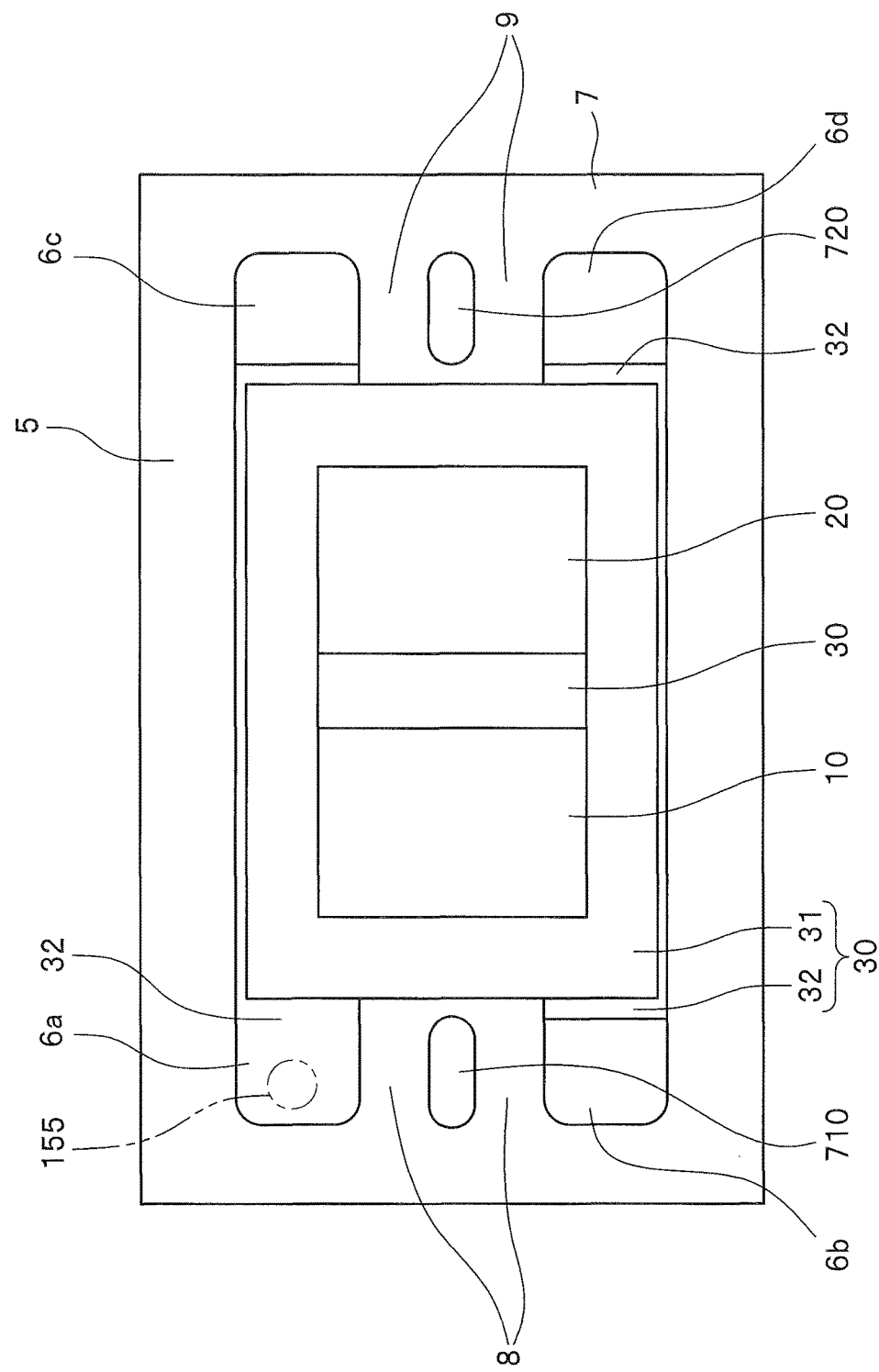
FIG. 12 is a schematic diagram of a manufacturing step of the package according to the embodiment, and is a plan view of the cured or solidified package.
Figure 13:
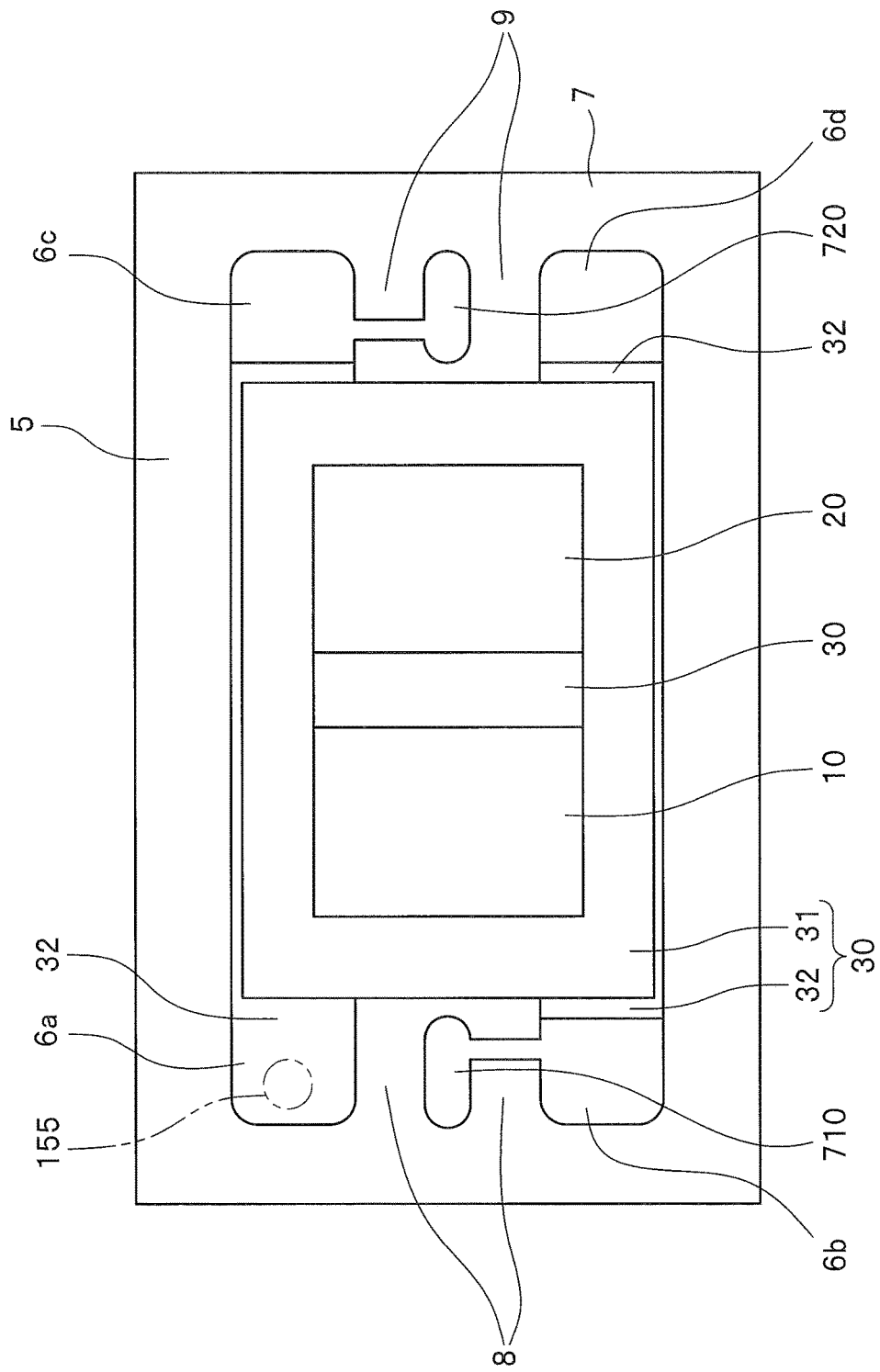
FIG. 13 is a schematic diagram of a manufacturing step of the package according to the embodiment, and is a plan view of the package after cutting out a portion of the border between the first electrode and the first connection portion.
Figure 14:
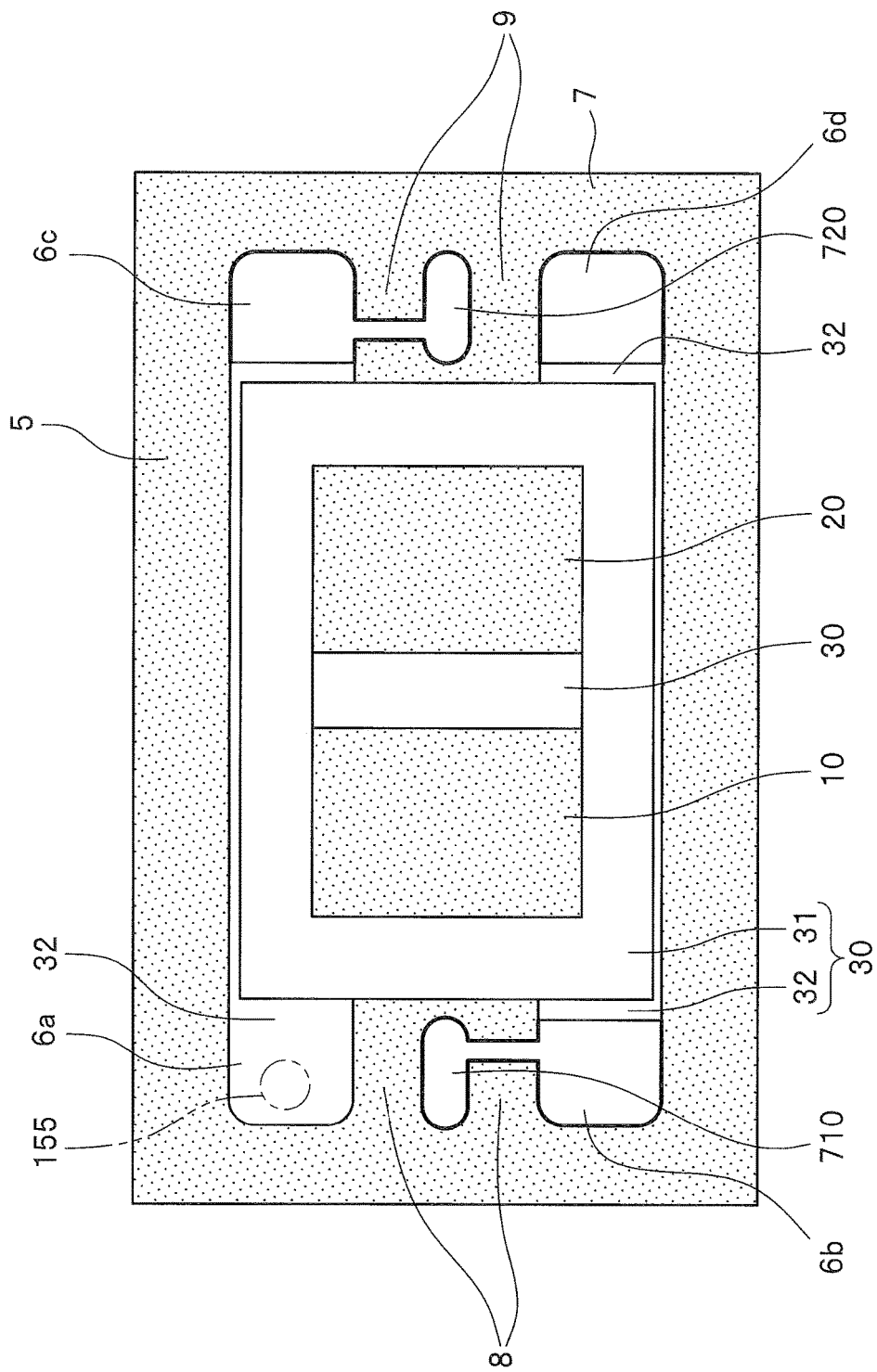
FIG. 14 is a schematic diagram of a manufacturing step of the package according to the embodiment, and is a plan view of the package after electroplating the first electrode.
Figure 15:
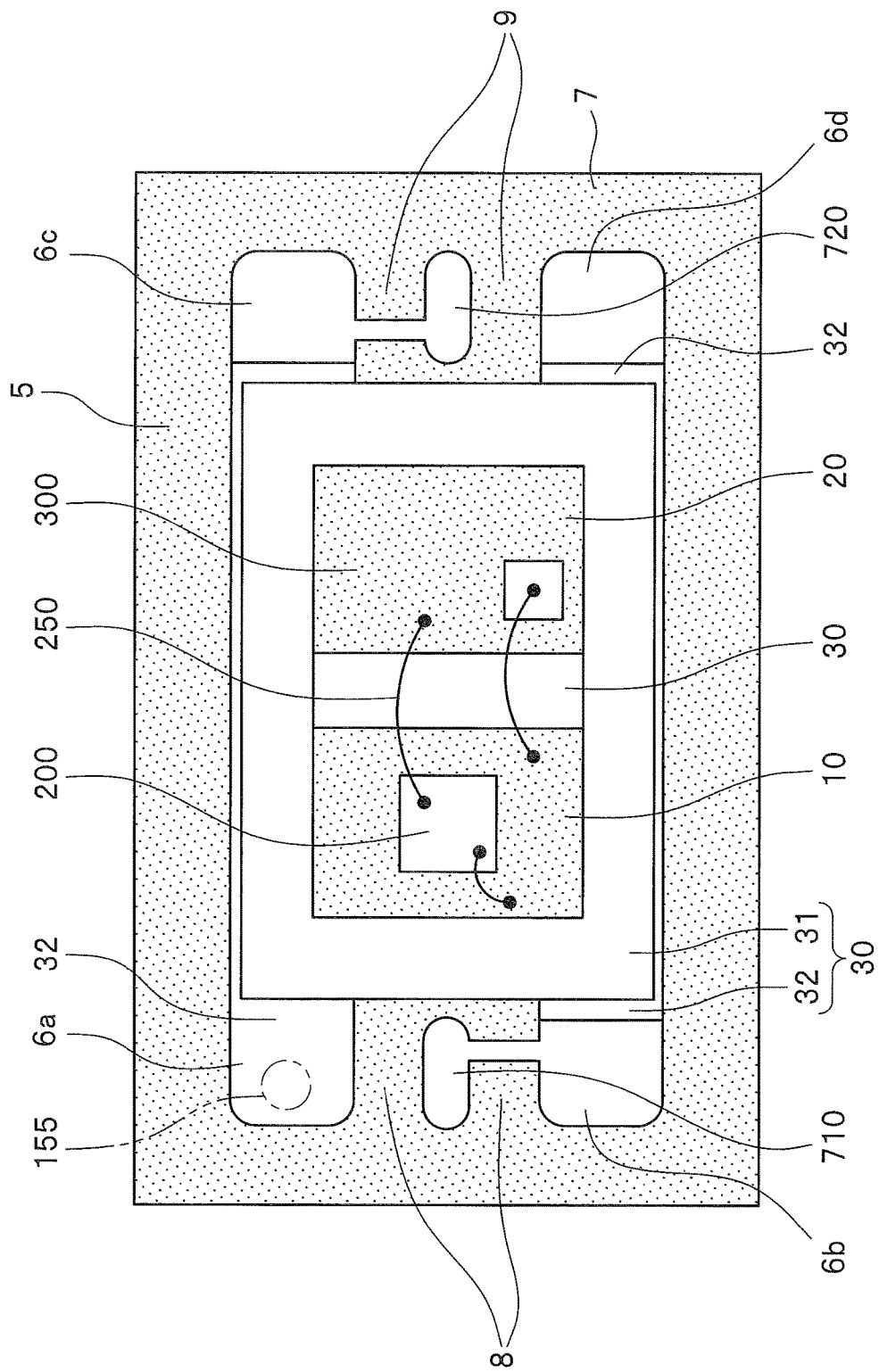
FIG. 15 is a schematic diagram of a manufacturing step of the package according to the embodiment, and is a plan view of the package after mounting a light emitting element on the first electrode.
Figure 16:
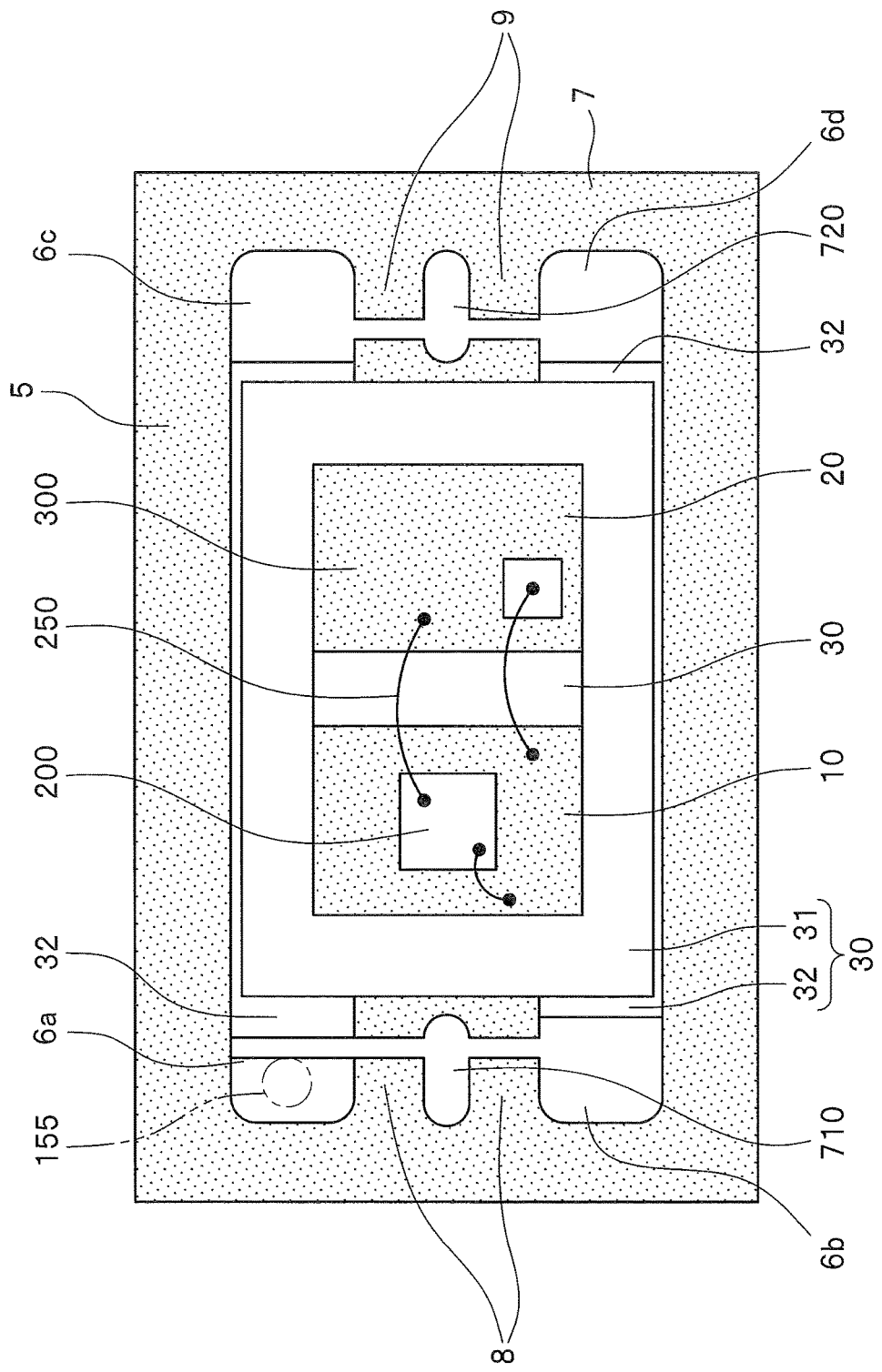
FIG. 16 is a schematic diagram of a manufacturing step of the package according to the embodiment, and is a plan view of the package after cutting out the remaining portion of the border between the first electrode and the first connection portion.
Figure 17:
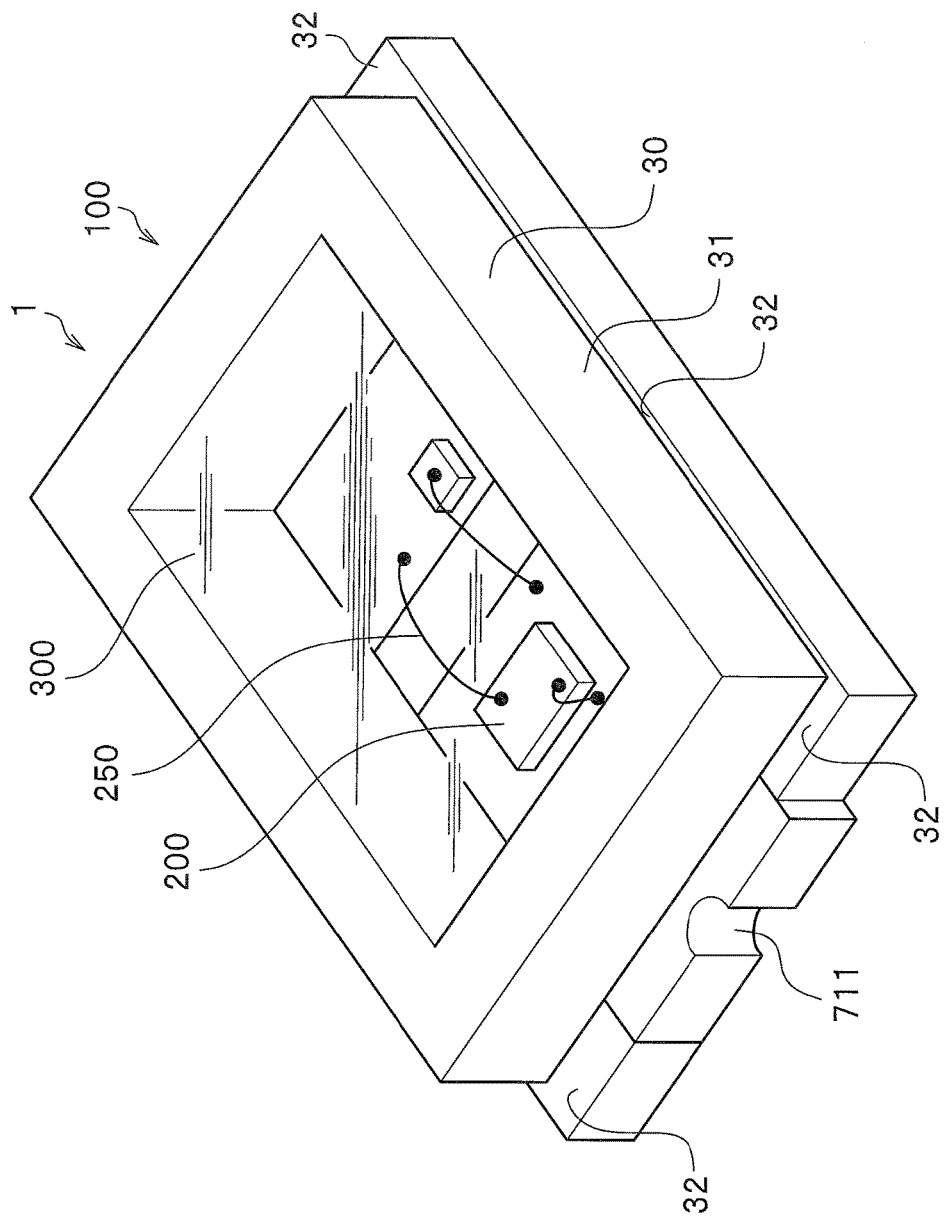
FIG. 17 is a schematic diagram of the light emitting device according to the embodiment, and is a perspective view of the whole light emitting device.

The method for manufacturing the package 100 and light emitting device 1 will be explained next with reference to FIG. 5 to FIG. 17. FIG. 5 is a plan view of the lead frame. FIG. 6 is a sectional view along line VI-VI indicated in FIG. 5. FIG. 7 is a schematic sectional view of the layout of the lead frame and the molding dies at the position corresponding to line X-X indicated in FIG. 9. FIG. 8 is schematic sectional view of the layout of the lead frame and the molding dies at the position corresponding to line XI-XI indicated in FIG. 9. FIG. 9 is a top view of the lead frame. This lead frame is clamped by the upper die and the lower die, but for explanation purposes, the lead frame is shown through the dies. FIG. 10 is a sectional view along line X-X indicated in FIG. 9 after injecting the first resin. FIG. 11 is a sectional view along line XI-XI indicated in FIG. 9 after injecting the first resin. FIG. 12 is a schematic plan view of the cured or solidified package. FIG. 13 is a schematic plan view of the package after cutting a portion of the border between the first electrode and the first connection portion. FIG. 14 is a schematic plan view of the package after electroplating the first electrode. FIG. 15 is a schematic plan view of the package in which a light emitting element has been mounted on the first electrode. FIG. 16 is a schematic plan view of the package after cutting the remaining portion of the border between the first electrode and the first connection portion. FIG. 17 is a schematic diagram of the light emitting device according to the embodiment, and is a perspective view of the whole light emitting device.

The method for manufacturing the package according to this embodiment has the steps (1) to (6) described below.

(1) Preparing Lead Frame

In the step of preparing a lead frame, a lead frame 5 is prepared which has a first electrode 10 and a second electrode 20 which differs from the first electrode 10 in the package forming area 600, a first through hole 710 on the first electrode 10 side at the position which straddles the outer edge of the package forming area 600, and a second through hole 720 on the second electrode 20 side.

Alternatively, a lead frame 5 is prepared which has a frame 7, a first electrode 10, a second electrode 20, a first connection portion 8 connecting the frame 7 and the first electrode 10, and a second connection portion 9 connecting the frame 7 and the second electrode 20, wherein a first through hole 710 is provided between the first electrode 10 and the first connection portion 8, and a second through hole 720 is provided between the second electrode 20 and the second connection portion 9. The flat sheet-form lead frame 5 has openings.

A gap is provided between the first electrode 10 and the second electrode 20. This gap is preferably in a width that roughly equals to the thickness of the lead frame 5 or wider. The first electrode 10 and the second electrode 20 each has a substantially quadrangle portion with rounded corners, and a portion that is narrower than the substantially quadrangle portion. The lead frame 5 has the first connection portion 8 and the second connection portion 9, which have about the same widths as those of the narrow portions of the first electrode 10 and the second electrode 20, and are connected thereto on the outside of the package forming area 600. The openings in the lead frame 5 can be formed by punching, cutting, etching, or the like. The package forming area 600 herein defines the outer perimeter of the area which will become the bottom face 105 of the molded package 100 when separated from the lead frame 5. Being separated from the lead frame 5 refers to the separation of the first electrode 10 and the second electrode 20 from the frame 7, the first connection portion 8 and the second connection portion 9. The first electrode 10 in the lead frame 5 means the portion corresponding to the first electrode 10 after molding, and is in a state prior to separation into an individual piece. Similarly, the second electrode 20 in the lead frame 5 means the portion corresponding to the second electrode 20 after molding, and is in a state prior to separation into an individual piece. For simplification purposes, the lead frame 5 will be explained as including a single package forming area 600, but the number may be plural.

The lead frame 5, which is a sheet material, has openings of prescribed shapes in the surrounding of the first electrode 10 and the second electrode 20, and the opposing portions of the first electrode 10 and the second electrode 20 are spaced apart. The lead frame 5 has a frame 7 that surrounds the first electrode 10 and the second electrode 20.

The portion of the first electrode 10, which corresponds to the first outer lead portion 11 after molding, is connected to the frame 7 by the first connection portion 8. The lead frame 5 has a first opening 6a and a second opening 6b as gap portions provided on both sides of the first electrode 10 or the first connection portion 8. As described later, in this embodiment, the first resin 30 is injected through the first opening 6a.

The portion of the second electrode 20, which corresponds to the second outer lead portion 21 after molding, is connected to the frame 7 by the second connection portion 9. The lead frame 5 has a third opening 6c and a fourth opening 6d as gap portions provided on both sides of the second electrode 20 or the second connection portion 9.

(2) Placing the Lead Frame in Dies

In the step of placing the lead frame in the dies, the first electrode 10 and the second electrode 20 of the lead frame 5 are clamped by the upper die 550 and the lower die 560 of the top/bottom split molding dies 500. For explanation purposes, the lower face of the lead frame 5 and the lower die 560 are shown apart, but the lead frame 5 is secured on the lower die 560. The lower die 560 has projected portions, and the projected portions are fitted into the second opening 6b, the third opening 6c, and the fourth opening 6d to secure the lead frame 5 in place. The projected portions formed on the lower die 560 come into contact with the upper die 550 to restrict the flow of the first resin 30. Since the second opening 6b, the third opening 6c, and the fourth opening 6d are not filled with the first resin 30, the openings are maintained. Thus, cutting and removal of the flange portions 32 can be omitted.

The upper die 550 of the molding dies 500 has a recess 501 that corresponds to the wall portions 31 of the first resin 30 to be formed on the first electrode 10 and the second electrode 20. The resin 30 is injected into the recess 501 formed in the upper die 550. The recess 501 formed in the upper die 550 is continuous and rectangular-ring-shaped. A through hole which serves as the injection port 555 is created in the upper die 550 at a different location from the recess 501, which is on the outside of the recess 501 in a plan view. The lead frame is clamped firmly enough to prevent the first resin 30 from penetrating between the gaps between the lead frame 5 and the upper die 550 and between the lead frame 5 and the lower die 560. If the first resin 30 were to penetrate the gaps between the lead frame 5 and the upper die 550 and between the lead frame 5 and the lower die 560, allowing the first resin 30 to be adhered on the surface of the lead frame 5 in the area where a light emitting element will be mounted, a step of removing burrs would be required.

(3) Injecting the First Resin into Dies and Molding

The upper die 550 of the molding dies 500 has an injection port on the outside of the package forming area 600. The first opening 6a of the lead frame 5 is provided in the portion corresponding to the injection port 555 of the upper die 550. The injection port 555 is for rued on the frame 7 side on one side of the first electrode 10. Here, a light reflecting material is premixed in the first resin 30 to be injected through the injection port 555.

In this step, the first resin 30 is injected through the injection port 555 located next to first electrode 10 and the first outer lead portion 11 in a plan view into the molding dies 500 in which the lead frame 5 is clamped by the upper die 550 and the lower die 560.

The lead frame 5 which has been prepared has the first opening 6a next to the first electrode 10 or the first connection portion 8, and the first resin 30 is injected through the first opening 6a. The first resin 30 injected through the injection port 555 passes through the first opening 6a of the lead frame 5 and is injected into the recess 501 of the upper die 550. Here, an explanation is given as being one injection port 555, but multiple ports can be provided in the upper die 550. Moreover, the injection port 550 is provided in the upper die 550, but the injection port can alternatively be provided in the lower die 560 to inject the first resin 30 from the lower die 560 side.

The step of injecting the first resin 30 can be accomplished by utilizing any known method, such as injection molding, transfer molding, extruding, or the like.

In this embodiment, the first resin 30 is assumed to be a thermosetting resin, such as an epoxy resin, for example. In this case, the step of injecting the first resin 30 is assumed to be performed by transfer molding. In advance of transfer molding, a thermosetting resin (tablets) in pellets of a prescribed size are placed in a prescribed container connected to the upper die 550. The steps (2) and (3) described above in the case of transfer molding will be briefly explained below.

In the case of transfer molding, in the step (2) described above, the lead frame 5 is secured on the heated lower die 560, and clamped between the similarly heated upper die 550 and the lower die 560. The dies 500 have the recess 501 which corresponds to the wall portions 31 to be formed on the first electrode 10 and the second electrode 20, and the first resin 30 will be injected into the recess 501. In the step (3) described above, by applying pressure to the prescribed container connected to the upper die 550 using a piston, for example, the molten thermosetting resin as the first resin 30 is injected to the recess 501 of the upper die 550 from the container through the injection port 555. The thermosetting resin which is the first resin 30 is then heated. The cured thermosetting resin by way of heating becomes the first resin 30. Curing can be performed in one stage, but is preferably performed in two stages where it is semi-cured at a slightly low temperature followed by fully curing at a high temperature. Two-stage curing can produce a sturdier first resin 30.

In the case where the first resin 30 is a thermoplastic resin, for example, a polyphthalamide resin, injection molding can be used. In this case, the thermoplastic resin to be injected in the dies 500 is melted at a high temperature, injected into the low temperature dies to be solidified by cooling.

The first resin 30 injected as described above is cured or solidified to form the wall portions 31 corresponding to the recess 501 of the upper die 550 of the top/bottom split dies 500.

(4) Cutting out a Portion of the Border between the First Electrode and the First Connection Portion After molding the first resin 30, a portion of the lead frame 5 which runs through the first through hole 710 or the second through hole 720 is cut out at the outer edge of the package forming area 600.

Alternatively, after molding the first resin 30, a portion of the border between the first electrode 10 and the first connection portion 8 running through the first through hole 710 is cut out. The first through hole 710 is located to straddle the first electrode 10 and the first connection portion 8. In other words, both the first electrode 10 and the first connection portion 8 are present on both sides of the through hole 710. The border between the first electrode 10 and the first connection portion 8 on one side is cut out. Since the first resin 30 is absent in the first through hole 710, all that is required is to cut the first connection portion 8. After severing the first electrode 10 from the first connection portion 8, the portion of the lead frame 5 located on the package 100 side becomes the first electrode 10, and the portion on the other side becomes the first connection portion 8. The first through hole 710 straddles the first electrode 10 and the first connection portion 8. Preforming the first through hole 710 in the lead frame 5 can reduce the area to be cut out in the cutting step. A portion of the first outer lead portion 11 becomes a part of the through hole 710.

The second electrode 20, the second connection portion 9, and the second through hole 720 can be cut in a similar manner to that applied to the first electrode 10, the first connection portion 8, and the first through hole 710, but the second electrode 20, the second connection portion 9 and the through hole 720 can be cut all at once.

Using a cutter or dicer, the portion of the border between the first electrode 10 and the first connection portion 8 can be cut all at once, or in several cutting operations.

The cut face of first electrode 10 severed from the first connection portion 8 is preferably flat, but may have irregularities. The cut face is preferably perpendicular to the plane of the first electrode 10, but may be oblique. The cut face will be covered with a metal in the subsequent plating step.

(5) Electroplating the First Electrode and the Second Electrode

The lead frame 5 having the first resin 30 molded thereon is removed from the molding dies 500, and the lead frame 5 is electrically connected for electroplating the first electrode 10 and the second electrode 20. Only the portions of the lead frame 5 that are exposed from the first resin 30 will be covered with a metal. Accordingly, the upper face and lower face of the first outer lead portion 11, the lateral face of the first indentation 711, the cut face, the upper face and the lower face of the first inner lead portion 12, the upper face and the lower face of the second outer lead portion 21, the lateral face of the second indentation 721, and the upper face and the lower face of the second inner lead portion 22 will be plated. The plating can be not only one layer, but also multiple layers having two or more layers. Multiple layers can be achieved by repeating the plating step.

(6) Cutting out the Remaining Border between the First Electrode and the First Connection Portion The first electrode 10, particularly the remaining portion of the border between the first outer lead portion 11 and the first connection portion 8 running through the first through hole 710 is cut out. Similarly, the second electrode, particularly the remaining portion of the border between the second outer lead portion 21 and the second connection portion 9 running through the second through hole 720 is cut out.

Alternatively, at the outer edges of the package forming area 600, the remaining portion of the lead frame 5 running through the first through hole 710, and the remaining portion of the lead frame 5 running through the second through hole 720 are cut out.

This step of cutting the remaining portions is preferably performed concurrently with the step of cutting and removing the injection mark 155 of the injection port 555. Cutting the injection mark and the remaining portions at the same time can make the end of the first electrode 10 coplanar with the flange portion 32. This provides the flange portion 32 with a different width from the width of the flange portion 32 formed in the second opening 6b. The flange portion 32 provided with a different width can serve as an anode mark or a cathode mark.

The upper face and the lower face of the first outer lead portion 11, the first indentation 711, and the lateral face at the end on one side are plated, while the lateral face corresponding to the remaining portion is not plated.

The injection mark 155 of the injection port 555 on the first resin 30 is cut and removed.

The injection mark 155 of the injection port 555 on the first resin 30 is cut and removed after curing or solidifying the first resin 30. The package 100 is separated by cutting the first resin 30 and the lead frame 5. The shorter sides of the rectangular package forming area 600 on the right and the left have the lead frame 5 and the first resin 30. The area of the lead frame 5 to be severed can be reduced by providing circular, elliptical, polygonal, or roughly polygonal cutouts or holes in the portions of the lead frame 5 which will be severed.

In this embodiment, the leads located at the shorter sides of the package forming area 600 are cut at the time of separating the package 100 from the lead frame 5, and the first resin 30 is held by the frame 7. Thus, the package 100 can be separated by applying a prescribed amount of pressure from the frame 7 to the package 100. Subsequent to the injection, and curing or solidification of the first resin 30, the portion corresponding to the recess 501 of the upper die 550 would have been filled with the first resin 30, and thus, the ends of the first resin 30 would also be cut at the same time.

The injection mark 155 on the first resin 30 next to the first electrode 10 can be cut and removed. This leaves no injection mark 155 on the surface of the package 100. The timing of the cutting may be before or after mounting a light emitting element 200. The package 100 can be produced by the steps (1) to (6) described above.

In conventional methods, resin was injected from the back face side of the package. In the method for manufacturing a package according to this embodiment, resin is injected from the location which is on the outside of the package forming area 600 and next to the first electrode 10, followed by cutting and removing the injection mark 155. Thus, the thickness of the package can be reduced.

Moreover, the method for manufacturing a package according to this embodiment does not require the step of bending leads as in the case of conventional package manufacturing methods, thereby reducing time and labor for the bending process.

In conventional manufacturing methods, in the case of preparing a sheet-form lead frame having multiple package forming areas arranged in a two dimensional array, for example, the prescribed spacing between them accounted for bending of the leads. In contrast, since the package manufacturing method according to this embodiment does not require the lead bending step, the need for securing the lead lengths that account for bending is eliminated. In other words, the spaces between the packages can be reduced by that much, which increases the number of packages resulting from the same sheet-form lead frame, thereby allowing for effective utilization of the material used for the lead frame.

Structure of the Light Emitting Device 1

The structure of the light emitting device 1 will be explained next with reference to FIG. 17. FIG. 17 is a schematic diagram of the light emitting device according to this embodiment, and is a perspective view of the whole light emitting device.

The light emitting device 1 includes a package 100, a light emitting element 200, wires 250, and a second resin 300. The light emitting element 200 is mounted on the second electrode 20 of the package 100. The shape and size of the light emitting element 200 used here are not particularly limited. For the emission color of the light emitting element 200, any wavelength can be selected in accordance with the applications. For example, a nitride semiconductor can be used as the light emitting element emitting blue light having a wavelength in a range between 430 and 490 nm. For the nitride semiconductor, $In_XAl_YGa_{1-X-Y}N$ ($0 \leq X \leq 1$, $0 \leq Y \leq 1$, $X+Y \leq 1$), or the like can be used. The light emitting device 1 may include a protective element, and the protective element may be covered with a second resin 300.

The wires 250 are conductive wires for electrically connecting the electronic components, such as the light emitting element 200 and the protective element, with the first electrode 10 and the second electrode 20. Examples of the materials used for the wires 250 include metals, such as gold, silver, copper, platinum, and aluminum, as well as their alloys. Particularly, it is preferable to use gold which has good thermal conductivity. The size of the wires 250 is not particularly limited, and can suitably be selected in accordance with the objectives and applications.

The second resin 300 covers the light emitting element 200 and the like that are mounted on the package 100. The second resin 300 protects the light emitting element 200 and the like from external forces, dust, and moisture, as well as improving the heat resistance, weather resistance and light resistance of the light emitting element 200 and the like. Examples of the materials for the second resin 300 include transparent materials, thermosetting resins, such as silicone resins, epoxy resins, and urea resins. In addition, these materials can contain a filler, such as a phosphor, and a substance having a high light reflectance, in order to have a prescribed function.

When mixed with a phosphor, for example, the second resin 300 can facilitate the color tone adjustment for the light emitting device 1. Any phosphor which has a higher specific gravity than the second resin 300, and absorbs and converts the wavelength of the light from the light emitting element 200 can be used. The phosphor having a higher specific gravity than the second resin 300 is preferable, as it settles near the first electrode 10 and the second electrode 20.

Specific examples include yellow phosphors, such as $Y_3Al_5O_{12}$:Ce (YAG) and silicate, and red phosphors, such as $CaAlSiN_3$:Eu (CASN) and $K_2SiF_6$:Mn (KSF).

For the filler to be contained in the second resin 300, any substance having a high optical reflectance, for example, $SiO_2$, $TiO_2$, $Al_2O_3$, $ZrO_2$, and MgO can suitably be used. For the purpose of cutting an undesirable wavelength, organic or inorganic pigments and dyes, for example, can be used.

Method for Manufacturing the Light Emitting Device 1

First Manufacturing Method

In the first method for manufacturing the light emitting device 1, a light emitting element 200 is mounted on the first electrode 10 or the second electrode 20 following step (5), but before step (6) of the method for producing the package 100. In other words, the light emitting element 200 is mounted on the first electrode 10 or the second electrode 20 of the package 100 which has not been separated from the lead frame 5.

The light emitting element 200 is of a single-sided electrode structure having a pair of n and p electrodes formed on the upper face. In this case, the back face of the light emitting element 200 is bonded onto the first electrode 10 using a die bonding material, one of the electrodes on the upper face is connected to the first electrode 10 using a wire 250, and the other electrode on the upper face is connected to the second electrode 20 using a wire 250.

Then, the second resin 300 is applied to the recess surrounded by the wall portions 31 of the first resin 30 of the package 100 to seal the light emitting element 200. At this point, the second resin 300 is dripped until it reaches the upper face of the recess of the first resin 30. The recess of the first resin 30 can be filled with second resin 300 by using methods, such as dripping, injection, compression, and extrusion. Filling by way of dripping is preferable because the air remaining in the recess of the first resin 30 can be effectively evacuated.

Second Method for Manufacturing the Light Emitting Device

In the first method for manufacturing the light emitting device 1, the light emitting element 200 was mounted on the first electrode 10 or the second electrode 20 of the package 100 before separating the package. In the second manufacturing method, the light emitting element 200 may be mounted on the package 100 after the step of separating the package 100. In other words, the light emitting element 2 is mounted on the separated package.

Variation 1

The lead frame 5 shown in FIG. 5 has a first opening 6a and a second opening 6b provided on both sides of the first outer lead portion 11. Two injection ports may be provided for injecting the first resin 30 through the two openings.

The upper die 550 of the molding dies 500 shown in FIG. 9 was explained to have one injection port 555, but two injection ports can be formed on both sides of the first electrode 10 through which the first resin 30 can be injected.

Injection ports can also be provided at locations corresponding to one or both sides of the second electrode 20 in addition to the location next to the first electrode 10 for injecting the first resin 30.

This can shorten the time for injecting the first resin 30. This also reduces the pressure applied when injecting the first resin 30. Injecting the first resin 30 from two injection ports and cutting and removing the injection ports while providing wide flange portions 32 can broaden the mounting face on the back face side, thereby improving the mounting stability.

Variation 2

The shape of the lead frame 5 shown in FIG. 5 is one example, and the first electrode 10 and the second electrode 20 may be made equal in size, or have different shapes from one another.

A through hole may be provided in the lead frame 5 at the center of each of the right and left short sides of the rectangular package forming area 600 indicated by virtual lines in FIG. 5.

Example

An example will be explained below with reference to the package according to this embodiment, but the invention is not limited to this example. The size of the example includes a tolerance of ±10%.

The size of the package 100 according to the example is about 2.2 mm in length×about 1.4 mm in width×about 0.7 mm in height. The size includes the first electrode 10 and the second electrode 20. The distance between the outer lateral faces 31a and 31c of the opposing wall portions 31 is about 2.0 mm, and the width of the outer lead portion 11 of the first electrode 10 and the outer lead portion 21 of the second electrode 20 is about 0.1 mm from the wall portion 31. The larger width flange portion 32 next to the first electrode 10 is 0.1 mm in width, while the smaller width flange portion 32 next to the first electrode 10 and the flange portion 32c next to the second electrode 20 are 0.05 mm in width. The tips of the outer lead 11 of the first electrode 10 and the outer lead 21 of the second electrode 20 extend about 0.05 mm from the tip of the flange portion 32c. The depth of the first indentation 711 and the second indentation 721 is about 0.05 mm from the tips. The thickness of the first electrode 10 and the second electrode 20 is about 0.2 mm. The distances between inner lateral faces of the wall portions 31 are about 1.65 mm in length×and about 1.1 mm, forming substantially a quadrangle with rounded corners.

Copper is used as the base material for the first electrode 10 and the second electrode 20, and the portions exposed from the first resin 30 are silver plated. A polyamide resin containing a light reflecting material is used for the first resin 30, and titanium oxide is used as the light reflecting material. A silicone resin is used for the second resin 300. Nitride semiconductor layers stacked on a sapphire substrate are used for the light emitting element 200. Wires containing gold as a major component are used for the wires 250 for electrically connecting the light emitting element 200 with the first electrode 10 and the second electrode 20.

The light emitting device according to the embodiment of the present invention can be utilized in lighting fixtures, automotive light emitting devices, and the like.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a package comprising:
   a step of preparing a lead frame which has a frame, a first electrode, a second electrode, a first connection portion connecting the frame and the first electrode, and a second connection portion connecting the frame and the second electrode, wherein a first through hole is provided between the first electrode and the first connection portion, and a second through hole is provided between the second electrode and the second connection portion;
   a step of placing the lead frame in dies;
   a step of injecting a first resin through an injection port of the dies in which the lead frame has been placed and molding the first resin;
   a step of cutting out a portion of a border between the first electrode and the first connection portion running through the first through hole, and cutting out a portion of a border between the second electrode and the second connection portion running through the second through hole after molding the first resin;
   a step of electroplating the first electrode and the second electrode; and
   a step of cutting out a remaining portion of the border between the first electrode and the first connection portion running through the first through hole, and cutting out a remaining portion of the border between the second electrode and the second connection portion running through the second through hole.

2. The method according to claim 1, wherein
   in the package, the first electrode has a first inner lead portion and a first outer lead portion, wherein a portion of the first outer lead portion is a part of the first through hole, and
   the second electrode has a second inner lead portion and a second outer lead portion, wherein a portion of the second outer lead portion is a part of the second through hole.

3. The method according to claim 1, wherein
   the prepared lead frame has a first opening formed next to the first electrode or the first connection portion, and the first resin is injected through the first opening.

4. The method according to claim 1, wherein
   the prepared lead frame has the first electrode spaced apart from the second electrode.

5. The method according to claim 1, wherein
   the step of cutting off the remaining portions is performed concurrently with the step of cutting and removing the injection mark of the injection port.

6. The method according to claim 1, wherein
   the dies have a recess that corresponds to the wall portions to be formed on the first electrode and the second electrode, and the first resin is injected into the recess.

7. The method according to claim 1, wherein
   the first resin molded by using the dies has wall sections securing the first electrode and the second electrode in place and structuring the lateral walls for the bottomed recess, the bottom face of which are structured by the first electrode and the second electrode at least in part, and a flange portion projecting outwardly from the wall portions, and
   the flange portion is formed next to the first outer lead portion in a plan view and have the same thickness as the thickness of the first outer lead portion.

8. The method according to claim 1, wherein
   the step of injecting the first resin is transfer molding or injection molding.

9. The method according to claim 1, wherein
   the first resin has a light reflecting material mixed therein.

10. A method for manufacturing a light emitting device comprising:
    the steps in the method for manufacturing a package according to claim 1, and
    a step of mounting a light emitting element on the first electrode or the second electrode after curing or solidifying the first resin at a timing before or after the step of cutting and removing the injection mark.

11. The method according to claim 10, further having a step of sealing the light emitting element by applying a second resin following the step of mounting the light emitting element.

12. The method according to claim 1, wherein
    the step of cutting out the portion of the border, the step of electroplating, and the step of cutting out the remaining portion of the border are executed in order.

13. A method for manufacturing a package comprising:
    a step of preparing a lead frame which has a first electrode and a second electrode different from the first electrode in a package forming area, a first through hole on a first electrode side at a position straddling an outer edge of the package forming area, and a second through hole on a second electrode side;
    a step of placing the lead frame in dies;
    a step of injecting a first resin through an injection port of the dies in which the lead frame has been placed and molding the first resin;
    a step of cutting out a portion of the lead frame running through the first through hole and a portion of the lead frame running through the second through hole at the outer edge of the package forming area after molding the first resin;
    a step of electroplating the first electrode and the second electrode; and
    a step of cutting out a remaining portion of the lead frame running through the first through hole and a remaining portion of the lead frame running through the second hole at the outer edge of the package forming area.

14. The method according to claim 13, wherein
    the step of cutting out the portion of the border, the step of electroplating, and the step of cutting out the remaining portion of the border are executed in order.

* * * * *